United States Patent [19]

Komatsu

[11] Patent Number: 4,589,936

[45] Date of Patent: May 20, 1986

[54] METHOD FOR FABRICATING A SEMICONDUCTOR DEVICE BY CO-DIFFUSION OF ARSENIC AND PHOSPHORUS

[75] Inventor: Shigeru Komatsu, Kamakura, Japan

[73] Assignee: Tokyo Shibaura Denki Kabushiki Kaisha, Kawasaki, Japan

[21] Appl. No.: 524,213

[22] Filed: Aug. 18, 1983

[30] Foreign Application Priority Data

Aug. 19, 1982 [JP] Japan ................. 57-143719

[51] Int. Cl.⁴ .......................................... H01L 21/385
[52] U.S. Cl. ..................... 148/188; 29/577 C; 148/190
[58] Field of Search ............... 148/190, 188, 186; 29/577 C

[56] References Cited

U.S. PATENT DOCUMENTS

| | | | |
|---|---|---|---|
| 3,748,198 | 7/1973 | Basi et al. ............... | 148/188 |
| 3,834,953 | 9/1974 | Nakamura et al. ......... | 148/190 X |
| 3,852,127 | 12/1974 | Lamming ................ | 148/187 |
| 3,879,230 | 4/1975 | Nakamura et al. ......... | 148/190 X |
| 4,226,650 | 10/1980 | Takahashi et al. ......... | 148/190 X |
| 4,261,765 | 4/1981 | Komatsu et al. .......... | 148/188 X |
| 4,263,067 | 4/1981 | Takahashi et al. ......... | 148/188 X |
| 4,272,304 | 6/1981 | Komatsu ................. | 148/188 X |
| 4,296,426 | 10/1981 | Gilles .................. | 148/190 X |
| 4,375,999 | 3/1983 | Nawata et al. ........... | 148/188 X |

FOREIGN PATENT DOCUMENTS

| | | |
|---|---|---|
| 0003926 | 9/1979 | European Pat. Off. . |
| 0043284 | 1/1982 | European Pat. Off. . |
| 2033660 | 5/1980 | United Kingdom . |

*Primary Examiner*—George T. Ozaki
*Attorney, Agent, or Firm*—Finnegan, Henderson, Farabow, Garrett and Dunner

[57] ABSTRACT

A semiconductor device is fabricated by selectively providing on a surface of a semiconductor body a plurality of impurity diffusion sources each containing an n-type impurity comprising phosphorus and arsenic, at least two of said impurity diffusion sources containing phosphorus and arsenic at a different ratio. The impurity is diffused by a single thermal diffusion step from each impurity diffusion source into the semiconductor body to form a plurality of n-type regions in the semiconductor body. At least two of the n-type regions will then have different diffusion depths.

10 Claims, 9 Drawing Figures

METHOD FOR FABRICATING A SEMICONDUCTOR DEVICE BY CO-DIFFUSION OF ARSENIC AND PHOSPHORUS

BACKGROUND OF THE INVENTION

1. Field of the Invention

The present invention relates to a semiconductor device and a method of fabricating the same and, more particularly, to a semiconductor device having n-type regions with different diffusion depths and to a method of fabricating the same.

2. Description of the Prior Art

Along with high performance and high packing density of semiconductor circuits, demands have arisen to fabricate semiconductor elements such as transistors having different electric characteristics such as different frequency characteristics, current gains, and dielectric withstand voltages in a single chip. The electric characteristics of a transistor vary in accordance with its geographic dimensions and an impurity region depth. For example, when an n-type emitter region is formed in a p-type base region, a current gain $\beta$ is increased while a dielectric withstand voltage is decreased with an increase in the depth of the emitter region.

In order to form n-type emitter regions having different diffusion depths in a single chip by the conventional technique, an n-type impurity is diffused in advance in a p-type base region at which a deep emitter region is to be formed. Subsequently, an n-type impurity is diffused simultaneously in both the p-type base region and another p-type base region at which a shallower emitter region is to be formed. As a result, the transistors having different diffusion depths (and hence different electric characteristics) can be formed within the single chip.

According to the above diffusion technique, the emitter impurity must be diffused at least twice to form a plurality of emitter regions having different diffusion depths. Each thermal diffusion process must be precisely controlled. However, if the thermal diffusion processes are repeatedly performed, the overall control of thermal diffusion processes becomes complicated and difficult. Therefore, it is difficult to form the regions having different diffusion depths with high precision. If the regions to be formed include a very shallow diffusion region, it is very difficult to form such a very shallow diffusion region while allowing satisfactory formation of other deeper regions.

SUMMARY OF THE INVENTION

It is, therefore, an object of the present invention to provide a method of fabricating a semiconductor device wherein a plurality of n-type regions having different diffusion depths are formed within a single substrate by a single thermal diffusion step.

It is another object of the present invention to provide a semiconductor device fabricated by the method described above.

Broadly, the method of the present invention includes the step of selectively providing on a surface of a semiconductor body a plurality of impurity diffusion sources each containing an n-type impurity comprising phosphorus and arsenic, at least two of said impurity diffusion sources containing phosphorus and arsenic at a different ratio. The impurity is diffused by a single thermal diffusion step from each impurity diffusion source into the semiconductor body to form a plurality of n-type regions in the semiconductor body. At least two of the n-type regions will then have different diffusion depths.

Preferably, the impurity diffusion source comprises a phosphorus- and arsenic-doped polycrystalline silicon layer. However, phosphorus and arsenic can be directly doped by, for example, ion-implantation in the surface layer of the semiconductor body to form a doped layer constituting the impurity diffusion source.

Of the n-type regions formed as described above, at least two regions have different diffusion depths. These regions having different diffusion depths have different concentration ratios of phosphorus to arsenic.

According to the present invention, a thermal diffusion process which is difficult to control need not be repeated to form n-type regions having different diffusion depths in the single substrate. N-type regions having different diffusion depths can be formed by a single thermal diffusion process, thereby increasing productivity. This method is very effective in forming n-type emitter regions of a plurality of npn transistors having different electric characteristics in a single substrate.

DETAILED DESCRIPTION OF THE PREFERRED EMBODIMENTS

The present inventor has found the following fact. When thermally diffusing impurities from a diffusion source containing phosphorus and arsenic into a semiconductor substrate, the diffusion rate of phosphorus is influenced by the arsenic concentration when the ratio of phosphorus to arsenic falls within a predetermined range. The diffusion depth of the n-type region which is determined by phosphorus is decreased in accordance with an increase in arsenic content.

Figure 1:
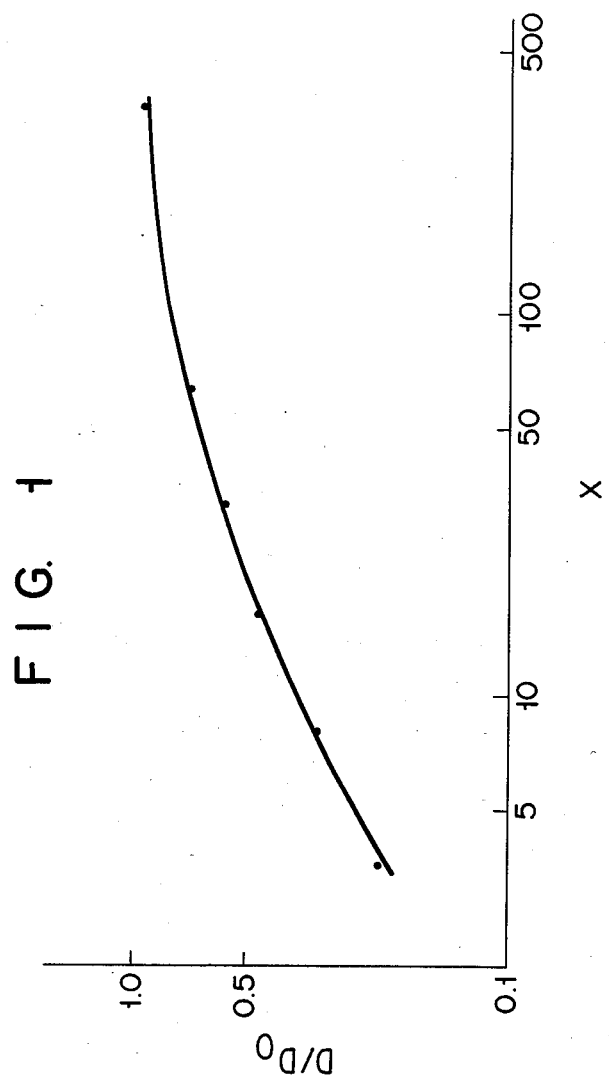
FIG. 1 is a graph for explaining the principle of the present invention.

More specifically, a polycrystalline silicon layer (2,000 to 4,000 Å thickness) containing phosphorus and arsenic in a ratio of 1 to 1/x is formed on a major surface of the silicon substrate. Heat treatment is then performed in a dry oxygen atmosphere at a temperature in the range between 900° C. and 1,000° C. to diffuse phosphorus and arsenic from the polycrystalline silicon layer into the semiconductor substrate. In this case, $D/D_0$ (where $D_0$ is the diffusion constant of phosphorus when arsenic is not contained and D is the diffusion constant of phosphorus when arsenic is contained in a ratio of 1/x) values were measured where the value of x varied. The results are plotted in the graph shown in FIG. 1. As will be apparent from this graph, it was found that the diffusion constant of phosphorus is decreased in accordance with an increase in arsenic content. In other words, a diffusion depth $x_j$ of an n-type region which is determined by phosphorus having a larger diffusion constant can be controlled in accordance with the content of arsenic having a smaller diffusion constant.

The present inventor has made further studies on the above phenomenon. As a result of such studies, it has been found that the diffusion depth of the n-type region is not determined only by arsenic content when the concentration of arsenic in the diffusion source is not greater than about 10 times the concentration of phosphorus (i.e., x is not less than about 0.1). In other words, it has been found that the diffusion profile of arsenic does not exceed that of phosphorus.

The present invention has been made by applying these experimental results to simultaneous formation of n-type regions having different diffusion depths in the semiconductor substrate. The basic process of the present invention will be described with reference to FIG. 2. An insulating layer 11 is formed on a semiconductor (e.g., silicon) substrate 10. Openings 11a and 11b are formed by a photoetching process in the insulating layer 11 to partially expose surface portions of the substrate 10.

Subsequently, polycrystalline silicon layers (diffusion sources) 12 and 13 having different concentration ratios of phosphorus to arsenic are deposited on the exposed portions of the substrate 10 through the openings 11a and 11b, respectively. The diffusion sources 12 and 13 are formed in the following process. A polycrystalline silicon layer containing phosphorus or phosphorus and arsenic at a predetermined ratio is formed to cover the entire surface of the substrate. A photoresist pattern is formed on the polycrystalline silicon layer such that the polycrystalline silicon portion corresponding to the opening 11a is covered, and only the polycrystalline portion corresponding to the opening 11b is doped by ion implantation with arsenic. Thereafter, the polycrystalline silicon layer is patterned to obtain the diffusion sources 12 and 13. The arsenic concentration in each of the diffusion sources 12 and 13 is a maximum of about 10 times the phosphorus concentration. In this case, the arsenic content with respect to the phosphorus content in the diffusion source 13 is larger than that in the diffusion source 12.

Thereafter, the resultant structure is preferably placed in a dry oxygen atmosphere at a temperature in the range, for example, between 900° C. and 1,000° C. to diffuse the impurities from the diffusion sources 12 and 13 into the substrate. As a result, n-type regions 14 and 15 are formed. The diffusion depth of the n-type region 15 obtained by diffusing the impurities from the diffusion source 13 having a higher arsenic concentration is smaller than that of the n-type region 14. In this case, the thermal treatment allows diffusion of the impurities and also formation of an oxide film (not shown) on the surfaces of the diffusion sources 12 and 13 by atmospheric oxygen to prevent diffusion of impurities outside the structure.

Figure 2:
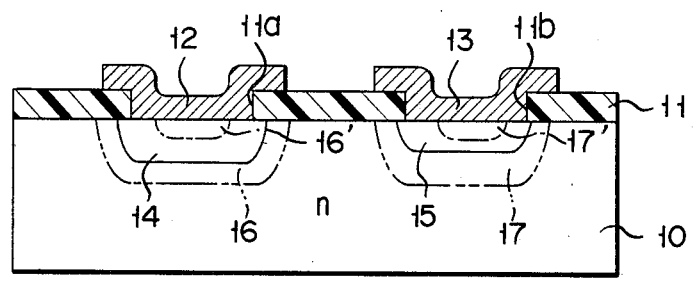
FIG. 2 is a view for explaining the basic process of the present invention.

The n-type diffusion regions 14 and 15 can be formed in p-type regions 16 and 17 (indicated by the alternate long and two dashed lines, respectively, in FIG. 2) separately formed in the semiconductor substrate 10, respectively. In this case, when the semiconductor substrate 10 has an n-type conductivity, npn transistors are prepared.

P-type regions 16' and 17' (indicated by the alternate long and dashed lines, in FIG. 2) can alternatively be formed in the n-type diffusion regions 14 and 15. In this case, when the semiconductor substrate 10 has a p-type conductivity, pnp transistors are prepared.

In general, the phosphorus concentration contained in the diffusion source falls within the range between $10^{17}$ atoms/cm$^3$ and $10^{20}$ atoms/cm$^3$, and the arsenic concentration therein is up to about 10 times the phosphorus concentration (usually within the range between $10^{15}$ atoms/cm$^3$ and $10^{21}$ atoms/cm$^3$).

As previously described, the electrical characteristics of an npn transistor, for example, can be changed in accordance with an emitter depth. In general, when the transistors have the same base depth, a great emitter depth tends to cause a high current gain $\beta$ and a low collector-base withstand voltage of the transistor. However, when the base depths differ in transistors and the current gains $\beta$ thereof are the same, a deep base region and a deep emitter region tend to cause a low cut-off frequency $f_T$ and a high collector-base withstand voltage.

From the above viewpoints, a plurality of transistors having different electric characteristics can be easily formed in a single chip by changing concentration ratios of phosphorus to arsenic between the diffusion sources.

Figure 3:
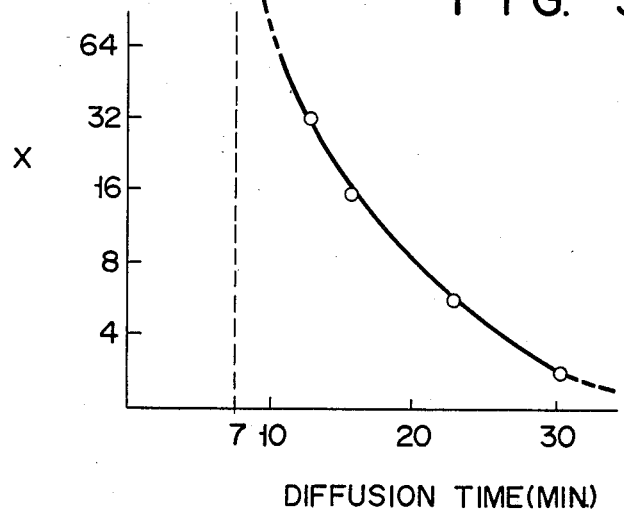
FIG. 3 is a graph showing the concentration ratio of phosphorus to arsenic contained in a diffusion source used in the present invention as a function of diffusion time.

A preliminary experiment can be readily made to determine a concentration ratio of phosphorus to arsenic, a diffusion temperature and a diffusion time so as to prepare a transistor having desired electric characteristics. Assume that an n-type impurity is diffused in a p-type base region (depth: 1 $\mu$m; and sheet resistance $\rho_s$: 300 $\Omega/\square$) formed in an n-type silicon substrate having the (100) plane to obtain a transistor having a current gain $\mu$ of about 100. In this case, when a diffusion temperature is preset to be 1,000° C., the value x of the concentration ratio of phosphorus to arsenic to be 1:1/x is plotted as a function of diffusion time, as shown in FIG. 3.

Fabrication of vertical npn transistors according to the method of the present invention in a single substrate to have different electrical characteristics will be described with reference to FIGS. 4A to 4F.

Figure 4A:
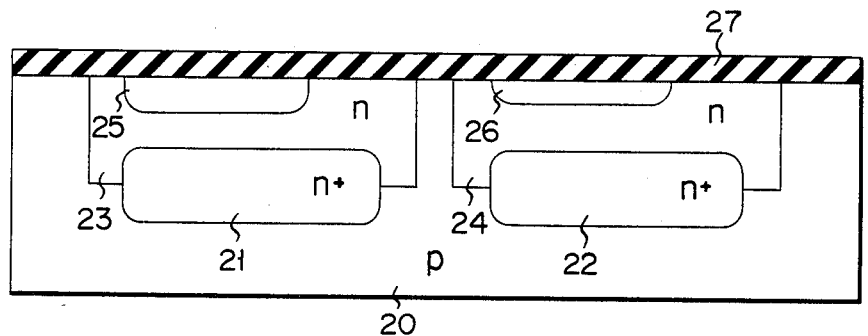
FIGS. 4A to 4F are views for explaining the steps of fabricating a semiconductor device according to an embodiment of the present invention.

Referring to FIG. 4A, a p-type silicon body 20 having n$^+$-type buried layers 21 and 22 and n-type island regions 23 and 24 formed separately and extending inward from the surface of the body 20 to reach the n$^+$-type buried layers 21 and 22, respectively, is prepared. The buried layers 21 and 22 and the island regions 23 and 24 are formed by high-concentration selective doping of an n-type impurity in the surface layer of a p-type silicon substrate, p-type epitaxial growth, and n-type impurity doping in the epitaxial layer. The island regions 23 and 24 serve as collector regions of transistors to be formed.

A p-type region 25 having a sheet resistance $\rho_s$ of about 300 $\Omega/\square$ and a junction depth $x_j$ of about 1 $\mu$m is formed in the island region 23. A p-type region 26 having a sheet resistance of about 500 $\Omega/\square$ and a junction depth $x_j$ of about 0.5 $\mu$m is formed in the island region 24. The p-type regions 25 and 26 serve as base regions of the transistors to be formed.

An insulating layer such as a silicon oxide layer 27 is formed to cover the entire surface of the silicon body 20.

Figure 4B:
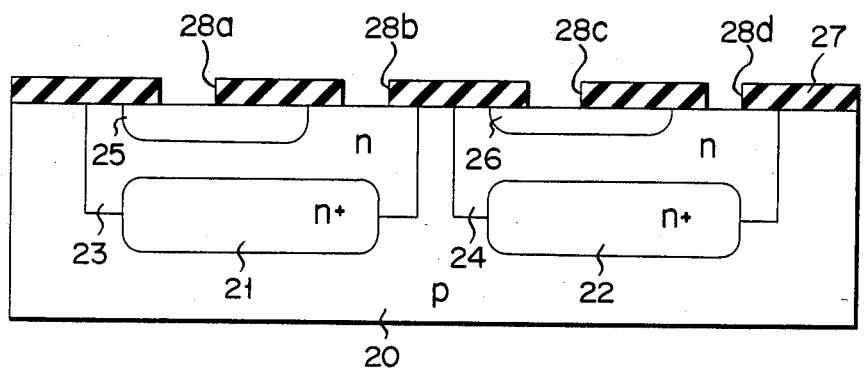

As shown in FIG. 4B, the insulating layer 27 is selectively etched to form openings 28a, 28b, 28c and 28d which partially expose surface portions of the regions 25, 23, 26 and 24, respectively.

Figure 4C:
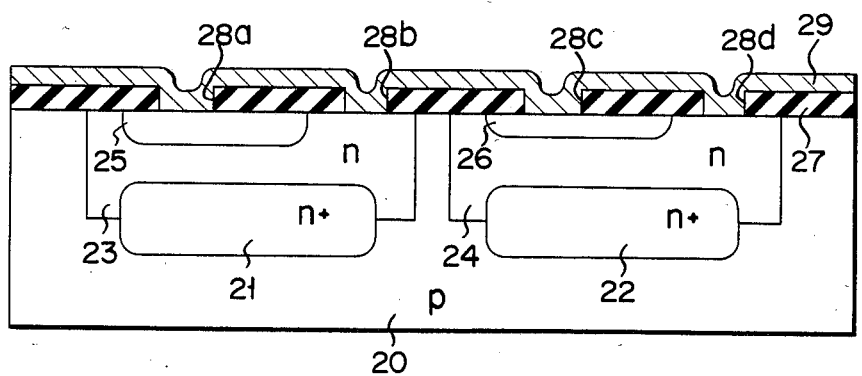

A polycrystalline silicon layer 29 doped with phosphorus and arsenic in a concentration ratio of, for example, 32:1 is formed to cover the entire surface of the structure of FIG. 4B, as shown in FIG. 4C. The polycrystalline silicon layer 29 can be formed by chemical vapor deposition in a silane atmosphere containing a phosphorus source (e.g., phosphine) and an arsenic source (e.g., arsine) such that an atomic ratio of phosphorus to arsenic is 32 to 1. The polycrystalline silicon layer 29 is in contact with the surface portions of the regions 25, 23, 26 and 24 through the openings 28a, 28b, 28c and 28d, respectively.

Figure 4D:
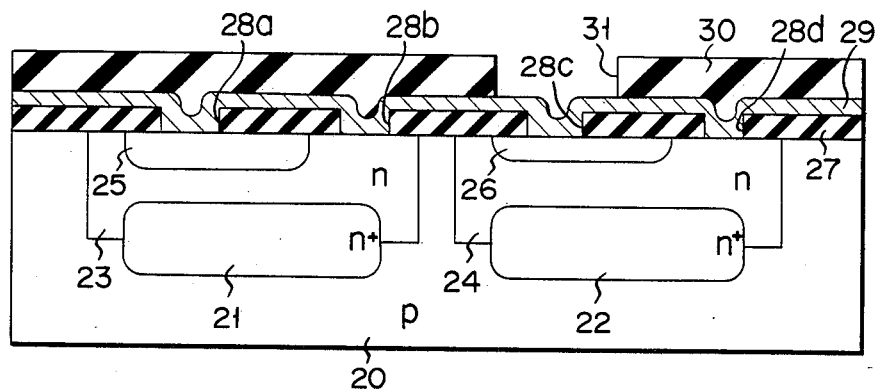

Thereafter, an insulating layer 30 such as a silicon oxide is formed to cover the entire surface of the structure shown in FIG. 4C. Only the portion of the insulating layer 30 which corresponds to the opening 28c of the insulating layer 27 is etched to form an opening 31 partially exposing the polycrystalline silicon layer 29, as shown in FIG. 4D. Using the remaining insulating layer 30 as a mask, arsenic is ion-implanted in the exposed portion of the polycrystalline silicon layer 29 through the opening 31 so as to adjust the concentration ratio of phosphorus to arsenic (in the exposed portion of the layer 29) to be, for example, 2:1.

Subsequently, the insulating layer 30 is removed, and the polycrystalline silicon layer 29 is patterned to leave the portions of the polycrystalline silicon layer 29 at least in the openings 28a, 28b, 28c and 28d, respectively. As a result, diffusion sources 29a, 29b, 29c and 29d are formed, as shown in FIG. 4E.

Figure 4E:
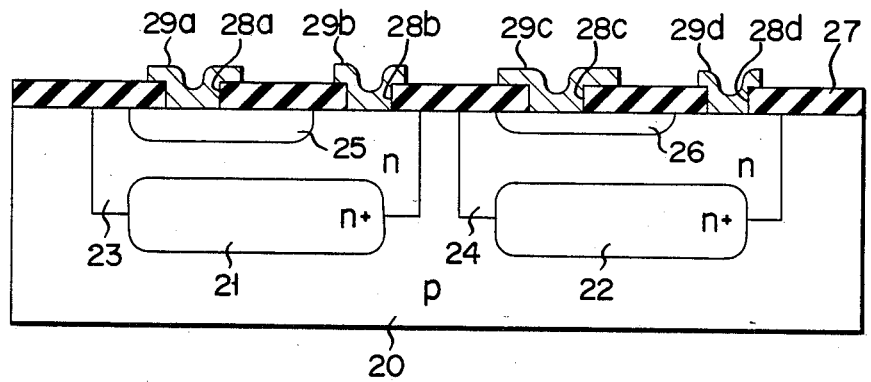
Figure 4F:
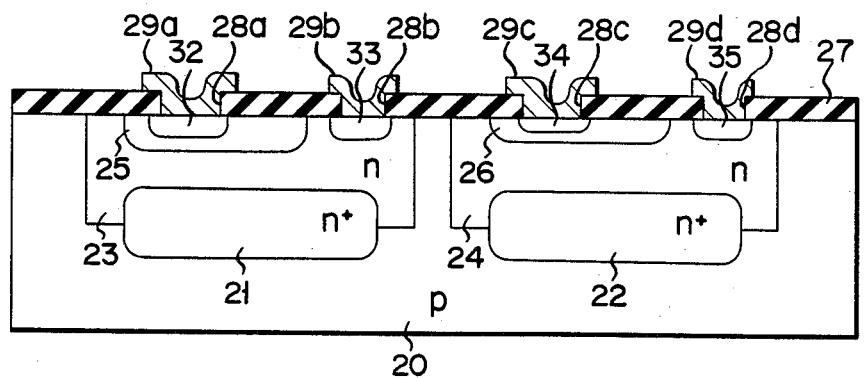

The structure shown in FIG. 4E is thermally treated once in a dry oxygen atmosphere at a temperature of 1,000° C. for about 12 to 13 minutes. Upon this thermal treatment, the impurities contained in the diffusion sources 29a, 29b, 29c and 29d are diffused in the silicon body 20, as shown in FIG. 4F. The impurity diffusion from the diffusion source 29a causes an n-type region (emitter) 32 to form in the p-type region 25. The impurity diffusion from the diffusion source 29b causes an n+-type region (collector contact region) 33 to form in the n-type region 23. The impurity diffusion from the diffusion source 29c causes an n-type region (emitter region) 34 to form in the p-type region 26. The impurity diffusion from the diffusion source 29d causes an n+-type region (collector contact region) 35 to form in the n-type region 24. The depths of the regions 32, 33 and 35 are substantially the same (about 0.7 μm), whereas the depth (about 0.3 μm) of the region 34 is smaller than that of these regions 32, 33 and 35.

The n-type island region 23, the p-type region 25 and the n-type region 32 constitute a first vertical transistor. The n-type island region 24, the p-type region 26 and the n-type region 34 constitute a second vertical transistor. In this case, the first vertical transistor has a current gain $\beta$ of about 100 to 120, a base-collector withstand voltage $V_{CBO}$ of 20 to 25 V, and a maximum cut-off frequency $f_{Tmax}$ of about 1.2 GHz. The second vertical transistor has a current gain $\beta$ of about 80 to 90, a base-collector withstand voltage $V_{CBO}$ of 20 to 25 V, and a maximum cut-off frequency $f_{Tmax}$ of about 2.5 GHz. The maximum cut-off frequency of the first vertical transistor greatly differs from that of the second vertical transistor.

In the embodiment described above, the base regions 25 and 26 have different depths but they may have the same depth. For example, if the same process is performed with the base regions 25 and 26 having the same depth (about 0.5 μm), two transistors having greatly different electrical characteristics can be obtained; a first transistor has a current gain of 900 to 1,000 and a base-collector withstand voltage of 8 V and a second transistor has a current gain of 100 to 120 and a base-collector withstand voltage of 20 to 25 V. In this case, the first transistor is suitably used as a high-input impedance transistor in an input stage, and the second transistor is suitably used as a high-withstand transistor in an output stage.

The present invention has been described with reference to the preferred embodiment. However, the present invention is not limited to the particular embodiment. For example, the diffusion source may be a doped layer obtained by selectively doping impurities in the surface layer of the semiconductor substrate. Further, the present invention can also be applied to formation of the n-type regions of pnp transistors formed in a single semiconductor body. Specifically, n-type base regions having different depths can be formed using corresponding diffusion sources containing phosphorus and arsenic at different ratios, in order to form pnp transistors.

What is claimed is:

1. A method of fabricating a semiconductor device, comprising the steps of:

selectively forming on a major surface of a silicon semiconductor substrate a diffusion source layer containing at least one n-type impurity selected from the group consisting of phosphorus and arsenic, and subsequently selectively doping said diffusion source layer with the other impurity, thereby forming at least two diffusion sources having different concentration ratios of phosphorus to arsenic; and diffusing by a single heat treatment said n-type impurities from said diffusion sources into said semiconductor substrate to form a plurality of n-type diffusion regions which correspond to said diffusion sources and at least two of which have different diffusion depths.

2. A method according to claim 1, wherein arsenic contained in said diffusion sources has a concentration up to about 10 times a concentration of phosphorus therein.

3. A method according to claim 1, wherein said diffusion sources comprise polycrystalline silicon.

4. A method according to claim 1, wherein said diffusion sources are formed by first depositing a polycrystalline layer containing one said impurity selected from the group consisting of phosphorus and arsenic, and then selectively ion implanting the other impurity in the polycrystalline silicon layer.

5. A method according to claim 1, wherein said semiconductor substrate has a plurality of p-type regions separated from each other, and said n-type diffusion regions are formed in said p-type regions, respectively.

6. A method according to claim 5, wherein said p-type regions have the same depth.

7. A method according to claim 5, wherein said n-type diffusion regions having different diffusion depths are formed in said p-type regions which have different depths.

8. A method according to claim 1, wherein p-type regions are formed in said n-type diffusion regions, respectively.

9. A method according to claim 1, wherein said heat treatment is performed in a dry oxygen atmosphere.

10. A method according to claim 1, wherein said heat treatment is performed at a temperature in a range between about 900° C. and about 1,000° C.

* * * * *